US006492068B1

United States Patent
Suzuki (10) Patent No.: US 6,492,068 B1
(45) Date of Patent: Dec. 10, 2002

(54) ETCHING METHOD FOR PRODUCTION OF SEMICONDUCTOR DEVICES

(75) Inventor: Koji Suzuki, Chiba (JP)

(73) Assignee: Kawasaki Steel Corporation, Kobe (JP)

( * ) Notice: Subject to any disclaimer, the term of this patent is extended or adjusted under 35 U.S.C. 154(b) by 0 days.

(21) Appl. No.: 09/478,789

(22) Filed: Jan. 7, 2000

(30) Foreign Application Priority Data

Jan. 12, 1999 (JP) ............................................. 11-005434

(51) Int. Cl.[7] ........................... G03F 9/00; H01L 21/302
(52) U.S. Cl. ............................ 430/5; 438/714; 438/725; 438/736
(58) Field of Search .................................. 438/725, 714, 438/736; 430/5

(56) References Cited

U.S. PATENT DOCUMENTS

| 4,863,558 A | | 9/1989 | Jucha et al. |
| 5,320,707 A | | 6/1994 | Kanekiyo et al. |
| 5,326,727 A | | 7/1994 | Kook et al. |
| 5,665,203 A | | 9/1997 | Lee et al. |
| 5,804,088 A | * | 9/1998 | McKee ........................ 216/47 |
| 5,900,163 A | * | 5/1999 | Yi et al. ........................ 216/79 |
| 5,928,965 A | | 7/1999 | Shoji et al. |
| 5,965,461 A | | 10/1999 | Yang et al. |
| 5,976,769 A | * | 11/1999 | Chapman ..................... 430/316 |
| 6,033,992 A | * | 3/2000 | Iyer ............................ 438/720 |
| 6,174,818 B1 | * | 1/2001 | Tao et al. ..................... 438/733 |

FOREIGN PATENT DOCUMENTS

| EP | 0 859 400 A2 | | 8/1998 |
| JP | 04-171726 | * | 6/1992 |
| JP | 10-312991 | | 11/1998 |
| WO | 99-52135 | * | 10/1999 |

OTHER PUBLICATIONS

"High Performance Etching Process For Organic Films Using $SO_2/O_2$ Plasma"; Jpn. J. Appl. Phys.; Part I; (1998); 37(46); pp. 2369–2372; Ohkuni et al.*

* cited by examiner

Primary Examiner—George Goudreau
(74) Attorney, Agent, or Firm—Oliff & Berridge, PLC (57) ABSTRACT

An etching method for use in production of semiconductor devices is disclosed. In the etching method, $CBr_x$ or its derivative formed in the plasma is deposited on portions of the surface of a substrate to be etched. A sidewall and/or underlying layer protection effect is obtained concurrently with an improved resist selectivity through the function of the high boiling point of the deposit.

14 Claims, 2 Drawing Sheets

ETCHING METHOD FOR PRODUCTION OF SEMICONDUCTOR DEVICES

BACKGROUND OF THE INVENTION

1. Field of Invention

The present invention relates to etching processes for use in the production of semiconductor devices.

2. Description of Related Art

The number of transistors that have been integrated in semiconductor integrated circuits has become higher and higher in recent years, which requires an etching process capable of forming fine patterns with a high etching selectivity. In order to form fine patterns by etching, it is necessary to form fine photoresist patterns that are used as masks in the etching processes. The focus depth in the photolithography process becomes shallower for a finer pattern, and a thinner photoresist (hereinafter simply referred to as "resist") film should be used.

Further, etching should be performed while controlling the shape of the patterns formed by the etching. In order to control the pattern shape, the sidewalls of the layer subject to etching should be protected. To this end, a process is employed, which comprises etching the resist layer and depositing the etched resist materials on the sidewalls of the layer subjected to etching. In this case, if the initial thickness of the resist layer is not sufficient, the resist film ingredients disappear during the etching, and the shoulders of the etched patterns are faceted. Namely, pattern shape degradation occurs. Because the protection of such sidewalls should be increased for finer patterns, the thickness of the resist film is on a trade-off relationship between the precision in the photolithography process and the pattern-shape maintenance in the etching process. Therefore, in order to achieve a highly precise processing with a thinner resist layer, it is required to provide an etching process capable of sufficiently protecting the sidewalls while mainlining a low etching rate of the resist layer, i.e., a high etching selectivity for the layer to be etched against the resist layer (resist selectivity).

In the etching process, the achievement of a high selectivity for the layer to be etched against the underlying layer (underlying layer selectivity) is essential in order to enhance the performance and reliability of the fabricated semiconductor devices. For example, in the etching to form gate electrodes, a high selectivity for the gate conductive layer against a gate oxide layer should be secured. Similarly, in silicon oxide etching to form contact holes, the selectivity against, for example, a Si substrate and a suicide layer formed on the Si substrate should be sufficiently high. Also, the selectivity against a silicon nitride etch-stop layer used in a self-alignment contact (SAC) process should be sufficiently high. Further, in via hole etching, the selectivity should be high against an underlying metal such as TiN used as an antireflection layer.

In addition, in the etching process, vertical sidewalls are not always most desirable. For example, a wiring pattern should preferably be etched in a normal taper manner in order to improve the coverage of an interlayer insulating film. Also, a contact hole or via hole should preferably be etched in a normal taper manner in order to improve the coverage of a metal wiring layer in the hole.

To achieve the satisfactory sidewall protection effect, the high resist selectivity, the high underlying layer selectivity and to control the angle of the sidewall, various etching gas atmospheres including a primary etching gas for producing a primary etchant species and a variety of additional gases have been investigated. For example, in oxide film etching using $C_xF_y$ gas as a primary etching gas, it was proposed to increase the C/F ratio in the plasma. Because F radicals serving as a primary etchant species are also capable of etching an underlying layer, such as a Si substrate, the surface of the underlying layer should preferably be covered with a protective film after the etch-off of the layer to be etched. By raising the C/F ratio, a number of $CF_2$ radicals and CF radicals, which act as precursors to form a polymer film, can be increased. A fluorocarbon protective film can be thereby formed on the exposed surface of the underlying layer. For this reason, as the primary etching gas for oxide etching, $C_2F_6$, $C_3F_8$ and other straight-chain fluorocarbons, and $C_4F_8$ and other unsaturated fluorocarbons having a large number of carbon atoms, have been used. As the additional gas, $H_2$, $CHF_3$, $CH_2F_2$, $CH_3F$ and other hydrogen-containing gases and CO have been used to scavenge excess fluorine in the plasma and thereby increase the C/F ratio in the plasma.

Meanwhile, in the fabrication of semiconductor devices with a design rule of 0.25 $\mu$m or less, a bottom antireflection coating (BARC) is widely used to enhance the precision of photolithography process. According to the process, a BARC layer composed of an organic substance is coated under a resist layer. The BARC layer serves to planarize the substrate surface, as well as to suppress the reflection of the exposing light from the underlying layer so as to improve the precision in the photolithography process. The BARC layer is etched using oxygen radicals as a primary etchant species after the development of the resist pattern. A layer to be etched is then etched using the resist pattern and BARC pattern as a mask. A dry etching technique may also be applied in developing the resist layer in the future. For instance, the surface of the resist is treated with a silylating agent such as hexamethyldisilazane (HMDS) before or after the photoexposure. A patterned silylated surface layer, which is resistant to oxygen plasma, is formed. And the resist in un-silylated regions are removed by reactive ion etching (RIE) using oxygen as a primary etching gas.

The above-mentioned conventional etching processes for use in the production of semiconductor devices have, however, the following disadvantages.

Etching is performed in various discharging types, such as reactive ion etching (RIE), magnetron enhanced reactive ion etching (MERIE), electron cyclotron resonance (ECR), and helicon-wave etching, and electron energy in one discharging type is different from that in another type. Further, a compound molecule has a specific dissociation energy. Accordingly, the etchant gas must be selected in accordance with the type of the etching system. Dissociation of a molecule cannot be significantly controlled with a high precision even if a suitable gas species for each etching system is selected. Therefore, in silicon oxide etching, a $C_xF_y$ gas cannot be controllably decomposed to obtain a sufficient amount of $CF_2$ radicals and/or CF radicals. The use of a gas having a high C/F ratio is preferred to improve the selectivity. However, the use of a gas having a high C/F ratio invites, for example, a decreased etching rate, difficulty in removal of the resist pattern after etching, and an increased contact resistance due to carbon implantation into the substrate surface.

Specifically, when a gas having a high C/F ratio is used, the etching rate is reduced due to a polymer film formed on the surface of the layer to be etched. If the discharging power is increased to compensate for such reduction in etching rate, $CF_2$ radicals and/or CF radicals are further dissociated to increase the amount of fluorine atoms. As a result, the underlying layer selectivity is sacrificed although the etching rate can be raised. As thus described, conventional gas systems, which are mainly directed to forming $CF_2$ radicals and/or CF radicals and to polymerizing the same, cannot yield a high resist and/or underlying layer selectivity while concurrently fulfilling other requirements.

In the BARC etching process, oxygen radicals serving as a primary etchant species etch the resist and BARC in a relatively isotropic manner, resulting in a loss of critical dimension (CD). A possible solution to the CD loss is to increase the substrate bias voltage. Ions accelerated by the substrate bias bombard the resist layer and organic species sputtered from the resist layer adhere on the sidewalls, thereby forming a protective film. Excessive adherence of the resist ingredients, however, causes a remarkable CD gain. Also, shoulders of the resist patterns facet and cause abnormal shapes of the etched layer, such as facets in the shoulders.

As thus described, the etching process proceeds with a delicate balance between various factors. Therefore, a high etching rate cannot be obtained concurrently with a satisfactory sidewall protection according to the conventional etching processes. The conventional processes havetherefore disadvantages, such as a low productivity and a large dimensional change depending on the density of the patterns.

In order to develop a resist layer by dry etching, the etching should be performed on a resist layer having a larger thickness than the BARC layer. Conventional etching processes cannot be applied to the resist development with a sufficient precision and productivity necessary for the mass production of semiconductor devices.

SUMMARY OF THE INVENTION

The present invention has been accomplished to solve the problems inherent in the conventional technologies, and it is an object of the invention to provide an etching method, which can yield a satisfactory sidewall protection concurrently with an improved resist and/or underlying layer selectivity.

According to one aspect of the invention, an exemplary method for forming a gate electrode of a semiconductor device comprises providing a semiconductor substrate having a stack of a resist mask layer, an organic coating layer, a conductive material layer, and a gate dielectric layer, the resist mask layer including a resist mask pattern partially masking the organic coating layer; etching the organic coating layer through the resist mask layer using an etching gas atmosphere including an oxygen-containing gas, a chlorine-containing gas, and a bromine-containing gas to form a pattern of the organic coating corresponding with the resist mask pattern, a width of the resist mask pattern is reduced during the etching of the organic coating layer, and a width of the pattern of the organic coating is determined by the reduced width of the resist mask pattern; and patterning the conductive material layer by etching through the pattern of the organic material.

Preferably, an amount of overetching in the etching is selected so that a desired amount of reduction of the width of the resist mask pattern is obtained.

Preferably, the oxygen-containing gas is $O_2$. Further preferably, the chlorine-containing gas is $Cl_2$ and the bromine-containing gas is hydrogen bromide.

Preferably, the organic coating layer is a bottom anti reflection coating (BARC) layer. The conductive material layer preferably includes a polycrystalline silicon layer.

According to another aspect of the invention, an exemplary method for manufacturing a semiconductor device comprises providing a semiconductor substrate having an organic material layer thereon and a mask layer having a mask pattern partially masking the organic material layer; and etching the organic material layer through the mask layer using an etching gas atmosphere including an oxygen-containing gas, a chlorine-containing gas, and a bromine-containing gas.

Preferably, the oxygen-containing gas is $O_2$. Further preferably, the chlorine-containing gas is $Cl_2$ and the bromine-containing gas is hydrogen bromide.

Preferably, the etching of the organic material layer includes substantially anisotropically etching to form a pattern of the organic material layer corresponding with the mask pattern, and laterally etching the formed pattern of the organic material layer. Preferably, a lateral dimension of the pattern of the organic material layer formed by the substantially anisotropic etching is substantially identical to a lateral dimension of the mask pattern before the etching.

Preferably, the mask pattern includes an isolated mask pattern having a first lateral mask dimension before the etching and a densely arranged mask pattern having a second lateral mask dimension before the etching; and etching the organic material layer forms an isolated pattern of the organic material layer corresponding with the isolated mask pattern and a densely arranged pattern of the organic material layer corresponding with the densely arranged mask pattern. The isolated pattern of the organic material layer has a first lateral dimension, the densely arranged pattern of the organic material layer has a second lateral dimension, and a first difference between the first pattern dimension and the first mask dimension is substantially identical to a second difference between the second pattern dimension and the second mask dimension. Preferably, a ratio of the oxygen-containing gas and the chlorine-containing gas in the etching gas atmosphere is selected so that the first difference is substantially identical to the second difference. Preferably, sidewalls of the isolated pattern have a first angle, and sidewalls of the densely arranged pattern have a second angle that is substantially identical to the first angle.

According to another aspect of the invention, an exemplary method for adjusting a lateral dimension of a resist mask pattern comprises providing a semiconductor substrate having a resist mask layer thereon, the resist mask layer including a resist mask pattern; and adjusting a lateral dimension of the resist mask pattern by laterally etching the resist using an etching gas atmosphere including an oxygen-containing gas, a chlorine-containing gas, and a bromine-containing gas.

Preferably, the oxygen-containing gas is $O_2$. Further preferably, the chlorine-containing gas is $Cl_2$ and the bromine-containing gas is hydrogen bromide.

Preferably, an angle of the sidewalls of the resist mask pattern after the adjusting is substantially identical to the angle of the sidewalls before the adjusting.

Preferably, the resist mask pattern include an isolated mask pattern and a densely arranged mask pattern, and an amount of the lateral etching on the isolated mask pattern during the adjusting is substantially identical to that on the densely arranged mask pattern. Preferably, the ratio of the oxygen-containing gas and the chlorine-containing gas in the etching gas atmosphere is selected so that the amount of the lateral etching on the isolated mask pattern is substantially identical to that on the densely arranged mask pattern.

Preferably, the sidewalls of the isolated mask pattern after the adjusting have a first angle, and the sidewalls of the densely arranged mask pattern after the adjusting have a second angle that is substantially identical to the first angle.

According to another aspect of the invention, a exemplary method for manufacturing a semiconductor device comprises providing a semiconductor substrate having an organic material layer thereon and a mask layer having a mask pattern partially masking the organic material layer; and etching the organic material layer through the mask layer using an etching gas atmosphere including an oxygen-containing gas and one of (i) a bromide of hydrocarbon or its derivative and (ii) a combination of a bromine-containing gas and a hydrocarbon or its derivative.

Preferably, the oxygen-containing gas is $O_2$.

Preferably, the etching gas atmosphere contains the bromide of hydrocarbon or its derivative. Preferably, the bromide of hydrocarbon or its derivative is vinyl bromide.

Preferably, the hydrocarbon is one of an alkene and an alkyne hydrocarbon.

Preferably, the amounts of bromine and carbon atoms in the etching gas atmosphere are selected such that a mole ratio of $CBr_4$ molecules in the etching gas atmosphere, calculated assuming that all of the bromine and carbon atoms are used to form the $CBr_4$ molecules, is between about 3 to 20 mole %.

Preferably, the mask pattern before the etching has a lateral mask dimension; the etching forms a pattern of the organic material having sidewalls and a lateral pattern dimension; the oxygen-containing gas produces oxygen radicals that isotropically etch the organic material; and the one of (i) the bromide of hydrocarbon or its derivative and (ii) the combination of the bromine-containing gas and the hydrocarbon or its derivative produces a sufficient amount of reaction product having a C—Br bond to protect the sidewalls of the organic material from the oxygen radicals such that the lateral pattern dimension is substantially identical to the lateral mask dimension.

According to another aspect of the invention, an exemplary method for manufacturing a semiconductor device comprises providing a semiconductor substrate having a dielectric layer thereon, a conductive material layer covering the dielectric layer, and a mask layer including a mask pattern partially masking the conductive material layer; and etching the conductive material layer through the mask layer, the etching including a main etching for etching substantially the thickness of the conductive material layer and an overetching for removing residues of the conductive material remaining on the dielectric layer, wherein the overetching comprises using an overetching gas atmosphere including an oxygen-containing gas and one of (i) a bromide of hydrocarbon or its derivative and (ii) a combination of a bromine-containing gas and a hydrocarbon or its derivative.

Preferably, the hydrocarbon is one of an alkene and an alkyne hydrocarbon.

Preferably, the etching gas atmosphere includes the bromide of hydrocarbon or its derivative. Preferably, the bromide of hydrocarbon or its derivative is vinyl bromide.

Preferably, the overetching gas atmosphere includes the bromide of hydrocarbon or its derivative and a bromine-containing gas.

Preferably, the overetching gas atmosphere includes $Br_2$ as the bromine-containing gas.

Preferably, the amounts of bromine and the carbon atoms in the overetching gas atmosphere are selected such that a mole ratio of $CBr_4$ molecules in the overetching gas atmosphere, calculated assuming that all of the bromine and carbon atoms are used to form the $CBr_4$ molecules, is between about 3 to 20 mole %.

Preferably, the overetching gas atmosphere further includes a primary etching gas that produces a primary etchant species; the etching of the residues of the conductive material is conducted primarily by the primary etchant species.

Preferably, the one of (i) the bromide of hydrocarbon or its derivative and (ii) the combination of the bromine-containing gas and the hydrocarbon or its derivative produces a sufficient amount of reaction product having a C—Br bond to protect the dielectric layer during the overetching so that etching of the dielectric layer is substantially prevented compared to conducting the overetching using an overetching gas atmosphere without the one of (i) the bromide of hydrocarbon or its derivative and (ii) the combination of the bromine-containing gas and the hydrocarbon or its derivative.

According to another aspect of the invention, an exemplary method of manufacturing a semiconductor device comprises providing a semiconductor substrate having a layer of a material to be etched thereon and a mask layer including a mask pattern partially masking the material layer; and etching at least a portion of the material layer through the mask layer using an etching gas atmosphere including one of (i) a bromide of hydrocarbon or its derivative and (ii) a combination of a bromine-containing gas and a hydrocarbon or its derivative, wherein the hydrocarbon is one of an alkene and an alkyne hydrocarbon.

Preferably, the etching gas atmosphere further includes a primary etching gas that produces a primary etchant species; the etching of the material layer is primarily conducted by the primary etchant species.

Preferably, the etching gas atmosphere includes the bromide of hydrocarbon or its derivative. Preferably, the bromide of hydrocarbon or its derivative is vinyl bromide.

Preferably, the etching gas atmosphere includes $Br_2$ as the bromine-containing gas.

Preferably, the amounts of the bromine and carbon atoms in the etching gas atmosphere are determined such that a mole ratio of $CBr_4$ molecules in the etching gas atmosphere, calculated assuming that all of the bromine and carbon atoms are used to form the $CBr_4$ molecules, is between about 3 to 20 mole %.

Preferably, the mask pattern has a lateral mask dimension before the etching; the etching forms a pattern of the material layer corresponding with the mask pattern, the pattern of the material layer has a lateral pattern dimension; and the one of (i) the bromide of hydrocarbon or its derivative and (ii) the combination of the bromine-containing gas and the hydrocarbon or its derivative produces a sufficient amount of reaction product having a C—Br bond to protect sidewalls of the pattern of the material layer such that the lateral pattern dimension is substantially identical to the lateral mask dimension.

Preferably, the semiconductor substrate also has an underlying layer under the layer of the material to be etched and the etching of the layer is continued until the underlying layer is exposed in unmasked portions; and the one of (i) the bromide of hydrocarbon or its derivative and (ii) the combination of the bromine-containing gas and the hydrocarbon or its derivative produces a sufficient amount of reaction product having a C—Br bond to protect the underlying layer so that etching of the underlying layer is substantially prevented as compared to conducting the etching using an etching gas atmosphere without the one of (i) the bromide of hydrocarbon or its derivative and (ii) the combination of the bromine-containing gas and the hydrocarbon or its derivative.

DETAILED DESCRIPTION OF PREFERRED EMBODIMENTS

The present invention was first disclosed in a Japanese Patent Application No. 5434/1999, which is incorporated herein by reference in its entirety.

The etching methods of this invention will be further illustrated with reference to preferred embodiments shown in the drawing.

Figure 1:
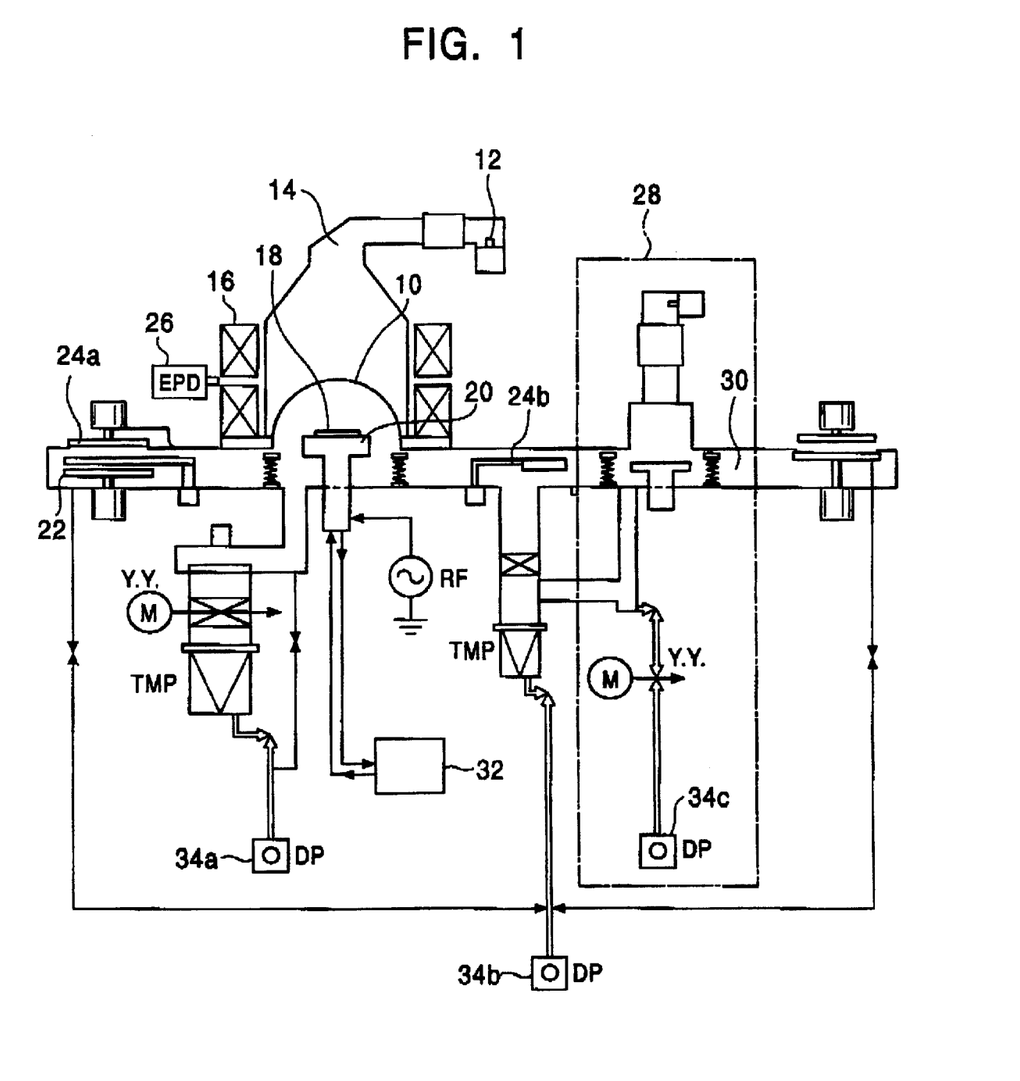
FIG. 1 is a schematic diagram of a configuration of a plasma etching system that can be used to perform the etching process according to this invention.

FIG. 1 is a schematic diagram of a plasma etching system for use in practicing the etching methods of this invention.

In the plasma etching system of FIG. 1, a discharge tube 10 is provided, over which a waveguide 14 is connected to a magnetron 12 for guiding microwaves generated in the magnetron 12 to the discharge tube 10. A solenoid coil 16 is provided around the outer periphery of the discharge tube 10. A stage 20, on which a substrate (a semiconductor wafer) 18 subjected to etching is placed, is provided in the inside (etching chamber) of the plasma discharge tube 10.

A high-density plasma is generated in the discharge tube 10, in which an etching gas atmosphere is provided by supplying constituent gases through a gas nozzle (not shown), by the interaction between the microwaves introduced from the waveguide 14 and a magnetic field generated by the solenoid coil 16. An radio frequency (RF) bias is applied to the substrate 18 by supplying a RF power to the stage 20. The plasma etching system etches the surface layer on the substrate 18 by applying radicals and/or ions produced in the high-density plasma.

The substrate 18 is transported by a transporting device 24a from a load-lock chamber 22 onto the stage 20 in the discharge tube 10, and is etched. A photo emission spectroscopic sensor 26 for monitoring the plasma is provided in the vicinity of the side of the discharge tube 10.

The etched substrate 18 is transported by a transporting device 24b to an ashing unit 28. The ashing unit 28 performs an ashing process to remove a resist layer by an oxidation reaction. The processed substrate 18 is removed from the etching system through a buffer chamber 30 and is transported to a subsequent process.

A circulator 32 is provided to control the temperature of the stage 20 within the range of about −50° C. to +50° C. By filling the space between the wafer stage and the wafer with helium, which has a high thermal conductivity, the temperature of the wafer during the etching can be precisely controlled. The discharge tube 10 and other chambers of the etching system are evacuated by turbo-molecular pumps (TMPs) backed by dry pumps 34a, 34b, 34c. Controlling the conductance of the valve provided between the discharge tube 10 and the respective TMP controls the pressure within the discharge tube 10.

An etching method for the production of semiconductor devices according to an exemplary embodiment of the present invention will now be described. The etching method according to the present invention comprises forming a bromine compound having one or more bromine-carbon bonds (i.e., $CBr_x$, where x=1, 2, 3 or 4) in the plasma to thereby deposit the bromine compound on desired portions of the substrate subject to the etching.

Such $CBr_x$ compounds are ones of the compounds having the highest boiling points among the reaction products of various etching systems, such as listed in Table 1 below. Among the compounds, $CBr_4$ has such a high boiling point (b.p.) of 189.5° C. (at 1 atm).

TABLE 1

| Material to be etched | Reaction Product | Boiling Point (1 atm) |
|---|---|---|
| Silicon | $SiCl_4$ | 57.6° C. |
|  | $SiBr_4$ | 153° C. |
|  | $CCl_4$ | 76.7° C. |
| Silicon Oxide | $SiF_4$ | −86° C. |
|  | CO | −191.5° C. |
|  | $CO_2$ | −78.5° C. |
| Metal | $AlCl_3$ | 182.7° C. (755 mmHg) |
|  | $TiCl_4$ | 136.4° C. |

According to the present invention, such reaction products having high boiling points are deposited on desired portions of the substrate subject to the etching, including the surface of the resist layer and other surfaces of the substrate. Consequently, the protection on the sidewalls of the etched layer or the underlying layer selectivity can be remarkably improved. In addition, $CBr_4$ can be converted into $COBr_2$ (b.p.=64.5° C.) through oxygen plasma treatment in, for example, the ashing process. The converted $COBr_2$ is highly volatile in a vacuum atmosphere and is soluble in water, and therefore can be easily removed by ashing and a subsequent cleaning process. From this viewpoint, $CBr_x$ compounds, particularly $CBr_4$, have superior properties to the other deposited materials such as conventional $CF_x$ polymers, which cannot be significantly removed by the ashing or cleaning process.

The $CBr_x$ compounds have high boiling points as described above, and cannot be conventionally introduced in the form of gases into the etching chamber. Adequate gas systems should be therefore selected to form gaseous $CBr_x$ compounds as plasma reaction products within the etching chamber. For example, in polycrystalline silicon gate etching, a $Cl_2$—HBr—$O_2$ etching gas atmosphere can be used. In this etching system, $CBr_x$ can be produced from carbon-containing species supplied by resist etching and HBr in the etching gas atmosphere. In this system, $Cl_2$ etches resist to supply carbon in the form of $CCl_x$, wherein x=1, 2, 3 or 4, to the etching gas system. The carbon atoms are then combined with Br atoms supplied from the HBr gas to yield $CBr_x$ reaction products.

Alternately, increasing a bias applied to the substrate and thereby enhancing the sputtering of the resist can enhance the carbon supply to the etching gas system. However, the resist etching rate must be inevitably increased in order to supply sufficient amounts of the carbon atoms to the etching system to thereby form sufficient amounts of $CBr_x$. Therefore, a satisfactory sidewall protection effect cannot be obtained with a thinner resist layer. In particular, when the sputtering of the resist is enhanced, the edges of formed patterns are faceted; namely, pattern degradation occurs.

In a preferred embodiment of the present invention, therefore, gases containing bromine and carbon atoms are supplied in the etching gas atmosphere. Specifically, $CBr_x$ or its derivatives are produced from a gas or gases added in advance in the etching gas atmosphere. That is, a gas having both bromine and carbon atoms in the molecule, or a combination of a carbon-containing gas and a bromine-containing gas, is added to the etching gas atmosphere. Chemical compounds having one or more C—Br bonds are produced in the etching system to thereby deposit $CBr_x$ or its derivatives on desired portions of the surface of the substrate subject to the etching.

Such gases having both carbon and bromine atoms in the molecule include, but are not limited to, methyl bromide ($CH_3Br$, b.p.=3.56° C.), vinyl bromide ($CH_2$=CHBr, b.p.=15.6° C.), ethyl bromide ($CH_3CH_2Br$, b.p.=38.40° C.), iso-propyl bromide (($CH_3)_2CHBr$, b.p.=59.41° C.), and other hydrocarbon bromides. Each of these compounds is a bromide of a hydrocarbon, in which one hydrogen atom of a hydrocarbon is substituted with a bromine atom, and which has one C—Br bond per molecule. Bromides of hydrocarbons each having a plurality of C—Br bonds, or bromides of hydrocarbons having a C=$Br_2$ or a C≡$Br_3$ bond in the molecule, in which a plurality of hydrogen atoms are substituted with bromine atoms can also be used. To form a molecule having both carbon and bromine atoms by a reaction in the etching system, a bromine-containing gas is, for example, used in combination with a hydrocarbon gas. Of such hydrocarbons, preferred examples are ethylene ($CH_2$=$CH_2$, b.p.=−102° C.), propylene ($CH_2$=$CHCH_3$, b.p.=−47° C.), 1-butene ($CH_2$=$CHCH_2CH_3$, b.p.=−6.5° C.), and other alkenes having a double bond, and acetylene (CH≡CH, b.p.=−75° C.), propyne (CH≡$CCH_3$, b.p.=−23° C.), 1-butyne (CH≡$CCH_2CH_3$, b.p.=9° C.), 2-butyne ($CH_3C$≡$CCH_3$, b.p.=27° C.), and other alkynes having a triple bond. Bromine-containing gases include, but are not limited to, $Br_2$ and HBr. These bromine-containing gases have no C—Br bond in the molecule, but yield substances having one or more C—Br bonds by the reaction with a hydrocarbon used in combination.

A combination of the bromine-containing gas with a hydrocarbon bromide gas, and a combination of a hydrocarbon bromide gas with a hydrocarbon gas also can be used. However, combinations of $Br_2$, HBr, or other bromine-containing gases having no C—Br bond with a hydrocarbon gas are advantageous with respect to the stability and availability of such gases.

Alternately, instead of the above hydrocarbons or hydrocarbon bromides, derivatives thereof having a variety of substituents can be used. Such derivatives of the hydrocarbons should be used in combination with any of bromine-containing gases unless the derivatives have a bromine atom in the molecule. As derivatives of the hydrocarbon bromides, carbonyl bromide ($COBr_2$, b.p.=−8° C. to −6° C.), dibromodifluoromethane ($CBr_2F_2$, b.p.=24.5° C.), or other derivatives having an oxygen or a fluorine atom in the molecule can also be used within the range adequate for the layer to be etched and the underlying layer.

Each of these derivatives of hydrocarbon bromides has a C=$Br_2$ bond in the molecule, and can form a deposit having a high Br/C ratio even if the derivative is used alone. Alternately, these derivatives can be used in combination with another substance to react therewith to thereby form a deposit. Particularly, carbonyl bromide can form >$CBr_2$ species having a high reactivity by the elimination of the oxygen atom from the molecule.

Of the aforementioned combinations, a combination of an alkene or alkyne hydrocarbon or its derivative having a double or triple bond in the molecule with a bromine-containing gas, particularly with $Br_2$, can efficiently yield $CBr_x$ reaction products by the following reaction:

When the hydrocarbon or its derivative has a double bond:

When the hydrocarbon or its derivative has a triple bond:

For achieving a strong sidewall protection to form an extremely fine pattern or a high underlying layer selectivity, a combination of an alkyne hydrocarbon or its derivative having a triple bond with Br, is preferred to thereby form a deposit having a high Br/C ratio. In contrast, if a higher priority is given to a high etching rate than a strong sidewall protection and a high selectivity, i.e., a high etching rate should be obtained with a moderate sidewall protection and selectivity, an alkene hydrocarbon or its derivative having a double bond is preferably used to thereby form a deposit having a decreased Br/C ratio. Likewise, use of a partially brominated alkene with a lower bromination rate is also effective to yield a deposit having a decreased Br/C ratio.

As described above, $CBr_x$ can be formed by a combination of a bromine-containing gas with a gas of a hydrocarbon or its derivative, or by the use of a gas of a hydrocarbon bromide or its derivative. The selection of adequate gases for use in the etching gas atmosphere can yield a deposit having an adequate Br/C ratio for an individual type of etching processes.

Generally, each of these gases (or combinations of gases) for forming $CBr_x$ is mixed with a primary etching gas to form an etching gas atmosphere. The primary etching gas produces radicals or ions serving as a primary etchant species by plasma excitation. For example, oxygen gas ($O_2$) that produces oxygen radicals can be used as a primary etching gas in BARC etching, and a $C_xF_y$ gas that produces F radicals can be used as a primary etching gas in $SiO_2$ etching.

When a derivative of an oxygen- or fluorine-containing hydrocarbon or hydrocarbon bromide is used as a gas for the formation of $CBr_x$ products, oxygen radicals or fluorine radicals can be obtained by the elimination from the gas. However, such a derivative alone cannot produce sufficient amounts of the etchant species so as to achieve a sufficient etching rates.

To independently control the etching activity by these etchant species and the protection activity for the sidewall and the underlying layer, it is preferred to select a gas or a combination of gases for the formation of $CBr_x$ and a separate gas for the formation of etchant species, and to mix the both. Specifically, when a derivative of a hydrocarbon or hydrocarbon bromide is used in a gas atmosphere for the formation of $CBr_x$, the derivative should preferably be one containing no atoms that serve as a main etchant species to the material of the layer to be etched. More particularly, for example, the derivative should preferably contain no oxygen atom in BARC etching, and contain no fluorine atom in silicon oxide etching. In this connection, fluorine, chlorine, and other halogens, which belong to the same family with bromine, may affect the reaction for the formation of $CBr_x$. Accordingly, the derivatives of hydrocarbons or of hydrocarbon bromides for use as a gas for the formation of $CBr_x$ should preferably contain no halogen atoms other than bromine.

The use of the gas (or the combinations of gases) for the formation of $CBr_x$ alone may yield Br radicals that can serve as a primary etchant of, for example, silicon. However, such gas or the combination of gases alone do not usually yield sufficient amounts of Br radicals to achieve a satisfactory etching rate. The gas for the formation of $CBr_x$ is therefore preferably mixed with another gas for the formation of a primary etchant to form an etching gas atmosphere.

The etching method for use in the production of semiconductor devices according to the present invention will be further illustrated with reference to several examples below, which are not limiting as to the scope of the invention.

In an exemplary embodiment, the etching method according to the present invention is applied to the formation of a gate electrode. Specifically, the etching method is first applied to an etching of a BARC layer and then to an overetching of a polycrystalline silicon layer.

In this embodiment, the plasma etching system shown in FIG. 1 is used. Microwaves (2.45 GHz) generated by the magnetron 12 are supplied to the discharge tube 10. The solenoid coil 16 provided around the discharge tube 10 generates a magnetic field of 0.0875 T, and a high density plasma is generated through the resonance between the cyclotron movement of electrons and the microwaves. Onto a lower electrode, a RF bias is applied for controlling the energy of ions irradiated on the substrate 18.

Samples used in the etching have a structure of resist (800 nm)/BARC (100 nm)/polycrystalline silicon (220 nm)/gate oxide (5 nm)/silicon substrate in the etching condition 1, and a structure of resist (800 nm)/BARC (110 nm)/thermal oxide (HTO; 100 nm)/WSix (100 nm)/polycrystalline silicon (280 nm)/gate oxide (8 nm)/silicon substrate in the etching condition 2. Specifically, the present invention is applied to BARC etching and to overetching in polycrystalline silicon etching in the present example.

At first, the etching method was applied to BARC etching alone in the formation of the gate electrode. Table 2 below demonstrates the outline of the conditions for BARC etching. In Table 2, X represents vinyl bromide as an example of bromides of alkene hydrocarbons. The etching gas atmosphere for use in the Example Condition 1 comprises $O_2$ as a primary etching gas, HBr as a bromine-containing gas, $Cl_2$ to etch the resist film and BARC to thereby supply carbon to the etching system, and Ar as a dilution gas. The BARC etching gas for use in the Example Condition 2 comprises $O_2$ as a primary etching gas, HBr as a bromine-containing gas and X as a bromide of alkene hydrocarbon, and Ar as a dilution gas. HBr and X provide for the formation of $CBr_x$ by the plasma reaction.

TABLE 2

|  | Comparative Condition | Example Condition 1 | Example Condition 2 |
| --- | --- | --- | --- |
| Ratio of Gas Flow Fate | $Cl_2:O_2:Ar$ = 1:1:7 | $Cl_2:O_2:Ar:HBr$ = 1:2:7:2 | $Cl_2:O_2:Ar:X:HBr$ = 1:2:5:6:1:2 |
| Pressure (Pa) | 1.0 | 1.0 | 1.0 |
| Microwave Power (W) | 600 | 600 | 600 |
| RF Power (W) | 15 | 20 | 30 |

Table 3 below shows the properties in the BARC etching.

TABLE 3

|  | Comparative Condition | Example Condition 1 | Example Condition 2 |
| --- | --- | --- | --- |
| BARC Etching Rate (nm/min) | 180 | 280 | 390 |
| BARC Etching Rate Uniformity (%) | ±2.9 | ±1.8 | ±1.5 |
| Resist Etching Rate (nm/min) | 150 | 230 | 260 |
| Resist Etching Rate Uniformity (%) | ±3.6 | ±2.5 | ±1.4 |
| BARC/Poly Si Selectivity (—) | 50 | 210 | 300 |
| BARC/Resist Selectivity (—) | 1.2 | 1.2 | 1.5 |

In this example, the primary etching gas is $O_2$, the primary etchant species is oxygen radicals, and the primary etching reaction is $C+O \rightarrow CO$. In addition, the following reactions also occur: $C+O_2 \rightarrow CO_2$, $C+2Cl_2 \rightarrow CCl_4$.

Table 3 shows that the conditions of the present invention in this example markedly improve both the etching rate and the underlying layer selectivity (BARC/poly Si selectivity) concurrently.

In the gas atmosphere according to the conventional method, $CCl_4$ formed by the reaction of $C+2Cl_2 \rightarrow CCl_4$ is used for sidewall protection. However, the amount of oxygen must be reduced to obtain a acceptable dimensional precision to prevent an isotropic etching activity of oxygen radicals. As a result, a high etching rate could not be obtained concurrently with a high dimensional precision. In contrast, according to the invention, the dimensional precision and underlying layer selectivity could be increased even though the amount of oxygen was increased to thereby increase the BARC etching rate, because the sidewall and the underlying layer are sufficiently protected by deposits of $CBr_x$.

Likewise, this type of etching can be generally applied to etching of, as well as BARC layers, resist layers, low dielectric constant insulating layers, and other layers predominantly containing an organic substance. Other oxygen-containing gases other than $O_2$ may also be used as primary etching gases as long as a sufficient amount of oxygen radicals are produced. When at least a low dielectric constant insulating layer is subjected to the etching, hydrogen gas or other gases, as well as oxygen gas, can be used as a primary etching gas for supplying a main etchant species.

Under the condition 1, $Cl_2$ etches the resist and BARC to thereby supply carbon in the form of $CCl_x$, where x is an integer from 1 to 4, to the etching system. The supplied carbon is combined with bromine, which is supplied from HBr, and yields $CBr_x$ to form a protective film. In addition to $CCl_x$, CO, $CO_2$ and the other carbon-containing species formed by the reaction of the resist and BARC with oxygen are also fed to the etching system. However, these carbon oxides have low reactivity and high vapor pressures, and are immediately exhausted out of the system. The $CCl_x$ compounds are therefore more advantageous than the carbon oxides as materials for the formation of $CBr_x$. Further, chlorine radicals formed from $Cl_2$ scavenge oxygen radicals in the etching system to thereby suppress the isotropic etching activity of the oxygen radicals. The ratio of $O_2$ to $Cl_2$ to be supplied to the etching gas atmosphere significantly affects the etching characteristics.

Such gases that can supply carbon in the form of $CCl_x$ and supply chlorine radicals for scavenging oxygen radicals in the same manner as $Cl_2$ include HCl and other chlorine-containing gases. Gases for supplying bromine include, as well as HBr, $Br_2$, BrCl, IBr, and other bromine-containing gases.

The etching gas atmosphere of the conditions 1 and 2 includes Ar. Such inert gases act to dilute other reactive components in the etching gas atmosphere. In addition, Ar has a high sputtering yield due to its high atomic weight. The sputtering helps to eliminate the formation of taper at the bottom of the etched pattern. Other inert gases may also have a similar effect. For example, the addition of He increases substrate bias potential, and enhances the sputtering effect by other ions.

Under the condition 1, however, the dimensions of the BARC pattern formed by the etching and the resist pattern remaining after etching decreased with an increasing degree of overetching of the BARC layer. During the main etching where the BARC etching is proceeding, even under the condition 1, sufficient amounts of materials for the formation of $CBr_x$ are supplied to the etching system through the resist and BARC etching. By this function, the sidewalls of the resist and BARC are sufficiently protected to thereby form a BARC pattern having almost the same dimension as that of the resist pattern immediately after the photolithography process. However, during the overetching, which is performed after the BARC etching is nearly completed, $CCl_x$ formed by BARC etching is not supplied to the etching system, and the amount of the carbon supplied to the etching system is decreased. Accordingly, sufficient amounts of $CBr_x$ may not be formed, resulting in an insufficient sidewall protection. If the condition 1 is applied to etching of an extremely fine gate structure, the degree of overetching of BARC layer should preferably be minimized.

In contrast, according to the condition 2, a carbon source in the form of the X gas is directly supplied to the etching gas atmosphere. Therefore, sufficient amounts of $CBr_x$ are produced to thereby form a protective film, even if no carbon-containing etched products formed by resist and BARC etching are supplied. Accordingly, dimensional reduction during overetching of the BARC layer can be efficiently suppressed. Etching according to the condition 2 should be advantageously applied to etching of an extremely fine gate structure, for example a gate structure having a line width of 0.18 μm or less. The condition 2 is also superior in the underlying layer selectivity to the condition 1, as shown in Table 3.

When a wiring pattern is formed in an organic low dielectric constant insulating layer according to a dual damascene technique, via holes and wiring troughs, in which the wiring pattern is formed, should be etched in the organic layer.

Since the depth of the via holes and the troughs are large, a film of SiO2, SiN, or other inorganic materials, which is not etched during the etching of the organic layer, is often used as a so-called hard mask. In this case, as carbon formed by resist etching is not supplied to the etching system, a large dimensional reduction may occur under the condition 1. Accordingly, both the carbon source and the bromine source should preferably be supplied in the form of gases added to the etching gas atmosphere, as in the condition 2. Particularly, the use of a carbon-containing gas having a double bond or a triple bond, as in an example of the condition 2, can yield $CBr_x$ polymers having high sidewall and underlying layer protection activities, even if carbon in the form of an etching product is not supplied.

On the assumption that all the carbon and bromine atoms contained in the gases flow into the etching chamber per unit time react and form $CBr_4$ in a stoichiometric manner, the molar fraction of $CBr_4$ in the overall etching gas atmosphere should preferably fall in the range of from about 3% to 20 mole %. In the condition 2 of the present example, the gas flow into the etching chamber comprises $Cl_2/O_2/Ar/CH_2=CHBr/HBr$ with flow rates of 10/25/60/10/20 standard cubic centimeter per minute (sccm). In an ideal gas approximation, its volume is proportional to the number of moles when the temperature and pressure are constant (PV=nRT), and the flow rate can be directly applied to a calculation of the molar 5 fraction. In the gas for use in the present example, the number of moles of carbon atoms is twice that of $CH_2=CHBr$, and the number of moles of bromine atoms is the total of the numbers of moles of $CH_2=CHBr$ and HBr. In the present example, the flow rate of HBr is only twice that of vinyl bromide, and the amount of formed $CBr_4$ is determined by the amount of Br, and is one-fourth thereof.

The amount of the formed $CBr_4$ is therefore $[CH_2=CHBr+HBr]/4=(10+20)/4=7.5$ sccm, and the proportion thereof in the initial gas flow is $7.5/(10+25+60+10+20)\times100=6.0\%$ The degree of precision of the BARC etching according to the condition 2 is examined in comparison with that of the comparative condition. After the BARC etching with the condition 2, the silicon oxide (HTO) film, the WSi film, and the polycrystalline silicon film, are etched with the use of a $CF_4$—$CHF_3$—Ar, a $Cl_2$—$O_2$, and a $Cl_2$—$O_2$—HBr etching gas atmosphere, respectively. Subsequently, the polycrystalline silicon film is overetched with an $O_2$—HBr etching gas atmosphere. The variations (3σ) of lateral (in-plane) dimensional variations in various patterns formed by this procedure are shown in Table 4.

TABLE 4

|  | Comparative Condition | Condition 2 |
|---|---|---|
| 0.5 μm Isolated Pattern (μm) | 0.028 | 0.010 |
| 0.5 μm Dense Pattern (μm) | 0.015 | 0.012 |
| 0.35 μm Isolated Pattern (μm) | 0.035 | 0.012 |
| 0.35 μm Dense Pattern (μm) | 0.032 | 0.013 |

Table 4 shows that the application of the condition 2 to BARC etching can markedly reduce the dimensional variation. By supplying both carbon and bromine sources into the etching gas atmosphere, the etching method of the present invention realized a precise control of the lateral dimension without sacrificing resist and underlying layer selectivity.

In contrast, the etching process according to the condition 1 can be advantageously used as a so-called trim etching process to adjust or control pattern dimensions. By way of an example, a series of patterns were formed in the following manner. A sample was subjected to a photolithography process using a mask of 0.25 μm width, and then to BARC etching under the condition 1, to etching of polycrystalline silicon layer with a $Cl_2$—$O_2$—HBr etching gas atmosphere, and to overetching with an $O_2$—HBr atmosphere, successively. The measured pattern dimensions are shown in Table 5. Two levels of an amount of overetching of 125 and 160% were employed in BARC etching. That is, end-point of the BARC etching was determined by photoemission spectroscopy and the etching was continued for the prescribed percentage of time relative to the time to the end-point. The pattern dimensions were measured at five points in the wafer, and mean values and variations (3σ) were calculated therefrom, and reductions of mean values from those after the photolithography process were calculated. The dimensions were measured both on an isolated pattern and on a densely arranged pattern (0.25 μm line-and-space pattern) in the same wafer with an electron beam measuring machine. Separately, Table 6 shows the variations and reductions after 160% overetching according to the comparative condition.

TABLE 5

| Dimension (μm) | After Photolithography Process | | Condition 1 (Overetching 125%) | | Condition 1 (Overetching 160%) | |
| --- | --- | --- | --- | --- | --- | --- |
| | Isolated | Dense | Isolated | Dense | Isolated | Dense |
| Mean | 0.266 | 0.264 | 0.217 | 0.209 | 0.200 | 0.200 |
| Variation (3σ) | 0.014 | 0.011 | 0.004 | 0.007 | 0.007 | 0.009 |
| Reduction (mean) | — | — | 0.049 | 0.055 | 0.066 | 0.064 |

TABLE 6

| Dimension (μm) | Comparative Condition (Overetching 160%) | |
| --- | --- | --- |
| | Isolated | Dense |
| Variation (3σ) | 0.020 | 0.018 |
| Reduction (mean) | 0.072 | 0.054 |

Table 5 demonstrates that the pattern dimension decreased according to the amount of BARC overetching. The dimensional variation did not increase and the difference in reduction between the isolated patterns and dense patterns was small.

The trim etching process under the condition 1, i.e., performing the BARC etching under the condition 1 with an adequate overetching amount to reduce the dimensions of the resist pattern and forming a BARC pattern in accordance with the dimensionally reduced resist pattern, and subsequently etching the polycrystalline silicon layer using the dimensionally reduced resist pattern and BARC pattern as a mask, can yield gate structures having a finer line width than the limitation of a photolithography process. Alternately, when a resist pattern having a dimension larger than a standard or targeted dimension is formed, the process under the condition 1 can reduce the pattern dimension to a required extent to form a gate structure having the standard dimension.

For these purposes, it is desirable that the reduction of the pattern dimension can be controlled in a wide range with high controllability, and that the sidewall angle of the resist pattern does not change.

The reduction at an overetching amount of zero percent, which was calculated from the data in Table 5, is very small, and specifically as small as less than about 0.01 μm. The result indicates that a marked dimensional reduction occurs not during BARC etching, but during overetching. During the main etching, sufficient amounts of materials for the formation of $CBr_x$ are supplied to the etching system through the resist and BARC etching. The sidewalls of the resist and BARC pattern are therefore sufficiently protected to thereby yield a BARC pattern having almost the same dimension as that of the resist pattern before the etching.

However, during overetching, which is performed after the BARC etching is almost completed, $CCl_x$ formed through the BARC etching is not supplied, and accordingly sufficient amounts of $CBr_x$ are not produced. Accordingly, etching by oxygen radicals of the sidewalls of the resist and BARC pattern in the lateral direction proceeds during the overetching.

That is, in the BARC etching under the condition 1, the BARC layer is substantially anisotropically etched during the main etching to form a BARC pattern with nearly the same dimension as the initial resist pattern. Thereafter, the etching in the lateral direction proceeds during the overetching to reduce the pattern dimension. Therefore, according to this process, the lower limit in the dimensional reduction, which is determined by a reduction that inevitably occurs during the main etching, is small, and the amount of reduction can be controlled within a wide range by controlling the amount of overetching. The amount of dimensional reduction was found to be increased in proportion to the amount of overetching even at an extremely large overetching of 300%.

Table 5 also shows that the dimensional variation does not increase even if the amount of overetching is increased to increase the dimensional reduction. In addition, the difference in dimension between the isolated pattern and the dense pattern is negligible. This result means that a high controllability can be obtained in the pattern dimensional reduction. The fact that the dimensional variation does not increase suggests that the change in the sidewall angle is minimal, which has been verified by the observation of cross-sectional shapes. It was also confirmed that the pattern of BARC after the dimensional reduction has sidewalls continuous with those of the resist pattern. Particularly, sidewalls of the resist pattern before the etching are substantially vertical, or have a normal slope with an angle of about 85° or more. After the etching, a stacked pattern composed of the resist layer and the etched BARC layer with a reduced lateral dimension and with continuous sidewalls having an angle of 85° or more is formed. No significant dependency of the sidewall angle on the pattern density was observed.

In contrast, in BARC etching under the comparative condition, not only the pattern dimension decreases but also the dimensional variation increases and the difference in dimension between the isolated and dense pattern is remarkably increased, as shown in Table 6. This etching process has therefore an unacceptable controllability in the pattern dimensional reduction. In the comparative condition, $CCl_4$ formed by the reaction of $C + 2Cl_2 \rightarrow CCl_4$ is used for the sidewall protection. Products in the etching system, however, diffuse isotropically onto the sidewall, and the formation of a protective film varies depending on the density of patterns. If patterns having a constant density alone were subjected to the etching, a desired pattern dimensional reduction could be achieved by adjusting the ratio of $Cl_2$ to $O_2$ and the degree of overetching. Or, the pattern dimensional reduction might be controlled to a desired value or less by reducing the amount of overetching. However, substantially the same dimensional reduction cannot be obtained on patterns having different densities.

In the BARC etching according to the present invention, carbon and bromine species serving as materials for the formation of $CBr_x$ are separately supplied to the etching system. That is, the bromine in the form of HBr gas and the carbon in the form of $CCl_x$ are respectively supplied to the etching system, which $CCl_x$ is produced though the etching of resist or BARC by $Cl_2$. Consequently, etching not depending on the pattern densities can be realized by setting the proportions of $Cl_2$ serving as a chlorine-containing gas, HBr serving as a bromine-containing gas, and $O_2$ serving as a primary etching gas, to adequate values. For example, adjusting the ratio of $O_2$ to $Cl_2$ adequately, while setting the ratio of $O_2$ to HBr to a constant value, can substantially eliminate dependency of etching on pattern density. Minimization of the dependency on the pattern density is also important even when the amount of overetching is decreased to perform etching which is not directed to the pattern dimension reduction.

As an example of conventional trim etching techniques, U.S. Pat. No. 5,965,461 discloses an etching process using an $O_2$—HBr etching gas atmosphere. In this gas atmosphere, however, the dependency on pattern density cannot be sufficiently eliminated for the same reasons with those in the $O_2$—$Cl_2$ gas atmosphere.

The application of the above-described trim etching is not limited to the etching of BARC or other organic layers. Even in the case that the resist pattern is formed by photolithography without using a BARC layer, the etching can be utilized to adjust the lateral dimension of the resist pattern.

Next, the etching method according to the present invention is applied to an overetching of polycrystalline silicon layer in the formation of the gate electrode. Table 7 below shows the conditions for the overetching, in which X represents vinyl bromide as a practical example of bromides of alkene hydrocarbons. In this example, the primary etchant species is Br radicals, and the primary etching reaction is $Si+4Br \rightarrow SiBr_4$. The polycrystalline silicon overetching gas atmosphere in the present example comprises HBr as a primary etching gas, and $Br_2$ as a bromine-containing gas and X as a bromide of an alkene hydrocarbon. The latter two gases provide for the formation of $CBr_x$. Although $CBr_x$ can be formed by X alone or a combination of X and HBr, X in the present example is used in combination with $Br_2$ to form a deposit having a high Br/C ratio to thereby yield high sidewall and underlying layer protection effects.

Oxygen added in the overetching gas atmospheres of the comparative condition (conventional process) and the example condition serves to oxidize and thereby protect the sidewall of the etched polycrystalline silicon layer. During the overetching of polycrystalline silicon according to this example, a high dimensional precision can be obtained concurrently with a high underlying layer selectivity due to the synergetic effect between the sidewall protection by the oxidation and the sidewall and underlying layer protection by $CBr_x$.

TABLE 7

| | Comparative Condition | Example Condition |
|---|---|---|
| Ratio of Gas Flow Rate | $O_2$:HBr = 1:20 | $O_2$:HBr:X:$Br_2$ = 1:12:2:3 |
| Pressure (Pa) | 1.0 | 1.0 |
| Microwave Power (W) | 600 | 600 |
| RF Power (W) | 25 | 25 |

Figure 2:
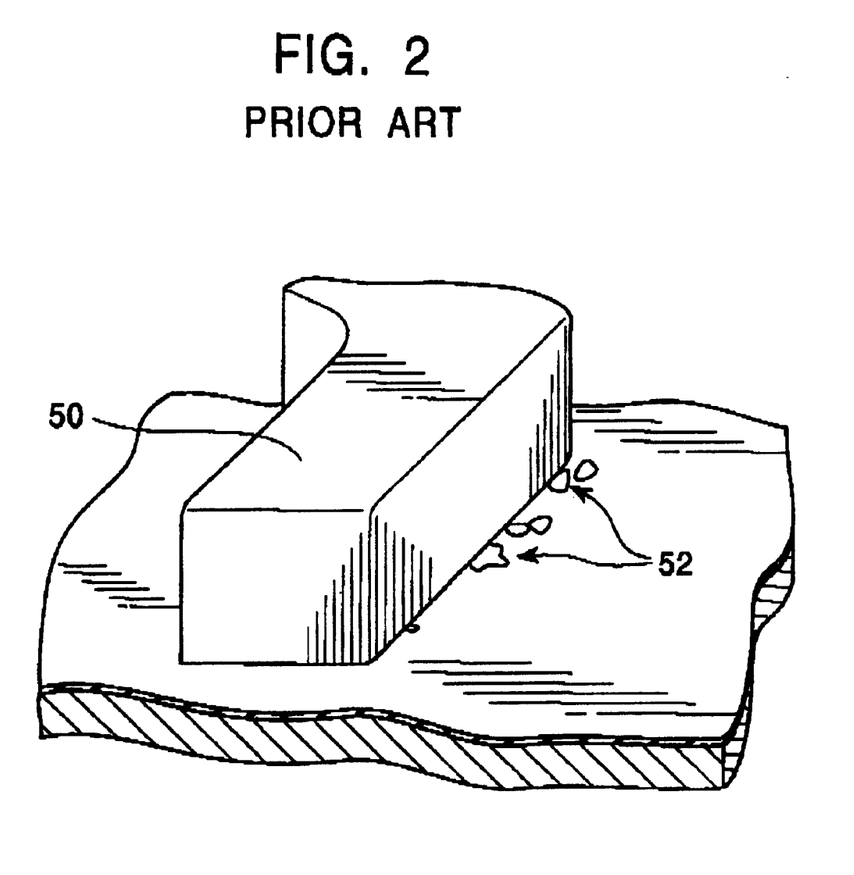
FIG. 2 illustrates the occurrence of a gate oxide film encroachment when a conventional etching process is applied.

FIG. 2 is an illustration of a sample that was subjected to an excessive amount of overetching (250%) under the comparative condition. FIG. 2 shows that gate oxide encroachment 52 occurred in the vicinity of etched polycrystalline silicon pattern (gate electrode) 50. However, according to the example condition, the selectivity against the gate oxide layer is improved, and no encroachment occurs.

This indicates that the example etching condition can be preferably applied to thinner gate oxide layer of finer semiconductor devices to be fabricated in the future.

U.S. Pat. No. 5,665,203 discloses a process for improving underlying layer selectivity during overetching. According to this reference, polycrystalline silicon is etched using a $Cl_2$—HBr—$O_2$ gas atmosphere and then $Cl_2$ gas is eliminated to a partial pressure of less than $10^{-6}$ Torr. After the elimination of $Cl_2$ gas, overetching is conducted using a HBr—$O_2$ gas atmosphere. However, the partial pressure of $Cl_2$ gas cannot be always easily controlled to less than $10^{-6}$ Torr in an etching chamber repeatedly used in the mass production. The etching chamber requires a long evacuation time to sufficiently eliminate $Cl_2$ contained in the etching gas atmosphere used in the polycrystalline silicon main etching. Thus, the productivity will be degraded. If overetching is conducted in a chamber separate from the chamber for the main etching, the partial pressure of $Cl_2$ gas can be easily reduced. However, a complicated etching system having a plurality of etching chambers is needed, and the productivity is deteriorated due to the time required for transporting the wafer from one chamber to another.

In contrast, for the overetching of this example according to the present invention, materials for the formation of $CBr_x$ are positively added to the etching gas atmosphere to form $CBr_x$ to thereby protect the underlying layer. Even when the main etching is performed using an etching gas atmosphere containing $Cl_2$ gas (or other gases that produce an etchant species capable to etch the underlying layer) and, subsequently, the overetching is performed in the same chamber, the overetching is not affected by the partial pressure of the residual $Cl_2$ gas. A stable and high underlying layer selectivity can be obtained. Thus, the required time to switch from the main etching to the overetching can be shortened while maintaining a high underlying layer selectivity, resulting in an improved productivity.

The aforementioned U.S. Pat. No. 5,665,203 discloses a technique of switching from the main etching to the overetching at a stage where a polycrystalline silicon film having a certain thickness remains. This technique ensures that a gate dielectric layer is not exposed to a main etching gas atmosphere having a low underlying layer selectivity. This technique can be also applied to the etching process according to the present invention.

The overetching according to the present invention can be applied for the patterning of layers of polycrystalline silicon, suicides, and other conductive materials, in particular of silicon-containing conductive materials. In addition, the process can yield a high selectivity against underlying layers such as oxide, oxynitride, and other dielectric layers.

The method according to the present invention can be applied to etch various layers in addition to BARC and polycrystalline silicon layer explained in the above embodiment.

For example, a silicon oxide layer can be etched using an etching gas atmosphere that comprises $CF_4$/$CHF_3$/Ar/CO/$CH_2$=CHBr with flow rates of 20/15/285/150/30 sccm. While, a comparative condition comprises $CF_4$/$CHF_3$/Ar/CO with flow rates of 10/15/285/100 sccm. A parallel plate reactive ion etching (RIE) system can be suitably used in this example.

In this case, the primary enchant species are F radicals and $CF_x$ radicals formed from $CF_4$ and $CHF_3$. Generally, the reaction in oxide etching is represented by the following formula:

Silicon is bonded with fluorine, and oxygen is bonded with carbon in the etching reaction. The oxide etching gas atmosphere according to the present example comprises $CF_4$ and $CHF_3$ both serving as a primary etching gas, and vinyl bromide serving as a bromide of an alkene hydrocarbon for the formation of $CBr_x$.

According to the present invention, the etching system comprises carbon and bromine atoms, and $CBr_x$ or its derivative produced in the plasma is deposited on desired portions of the surface of the substrate to be etched. Therefore, a satisfactory sidewall and/or underlying layer protection effect can be obtained concurrently with an improved resist selectivity. In addition, the improved selectivity enlarges the margin for increasing the etching rate.

Particularly, when the carbon and bromine atoms are supplied in constitutent gases of the etching gas atmosphere, there is no need for etching the resist to supply the carbon for the formation of $CBr_x$. Consequently, problems such as the abnormal shaping of the etched pattern due to an excessive resist etching, CD variation due to over- or short-consumption of the resist, and the reduced productivity due to the trade-off relationship between the etching rate and the sidewall protection can be solved. In addition, it is not necessary to use $C_4F_8$ or other gases having high C/F ratios in silicon oxide etching. In other words, the present invention can achieve a sufficient sidewall protection effect, as well as high resist and underlying layer selectivity, without the use of a gas having a high C/F ratio. Therefore, problems in silicon oxide etching related to the use of a gas having a high C/F ratio including the etching stop phenomenon, decreased etching rate due to the formation of thick deposit layers, and difficulty in removing the resist pattern after etching, can be eliminated.

The deposit of $CBr_x$ utilized in the present invention has a high boiling point and etching resistance. Therefore, etching in exact accordance with the resist pattern, i.e., formation of a pattern of the etched layer having almost exactly, or substantially, the same lateral dimension of that as the initial resist pattern, can be realized. Particularly, the high resist selectivity realized by supplying carbon and bromine atoms for the formation of the deposit in the etching gas atmosphere enables the use of a thinner resist layer. Therefore, finer resist patterning is possible. Furthermore, a higher etching rate can be obtained concurrently with a high selectivity by separately selecting a gas or gases for the formation of the deposit and a gas for the formation of a primary etchant species.

The etching methods according to the present invention can be flexibly utilized for a variety of materials to be etched, and the selectivity and other desired etching properties can be realized by selecting a suitable gas system.

In the etching methods according to the present invention, $CBr_x$ compounds in the form of a deposit serve to protect the sidewall. $CBr_x$ on the surface to be etched can be converted into $COBr_2$, $CCl_4$, or $CF_4$ by the aid of the etchant and/or the energy of incident ions. The balance between the etching rate and the sidewall protection can be controlled by, for example, controlling the energy of incident ions.

The $CBr_x$ compound is converted by oxygen plasma into $COBr_2$ and the converted $COBr_2$ can be easily removed by an ashing process and/or wet cleaning process, because it has a low boiling point and is soluble in water.

An important feature of the invention resides in the formation of $CBr_x$ in the etching gas system to deposit on desired portions of the surface of a substrate to be etched. Accordingly, substances or materials to be etched are not limited to those mentioned above, and the etching gas system may further comprise other atoms or radicals in addition to those mentioned above within a range that does not deteriorate the required properties. The aforementioned hydrocarbons, hydrocarbon bromides, and derivatives thereof are listed as exemplary compounds that have relatively low boiling points and can be easily supplied in the form of gases to the etching gas atmosphere. However, even substances having high boiling points can be introduced into the etching gas system by heating with a heater or with an energy beam.

As described above, the etching method of the present invention, in which $CBr_x$ or its derivative, or other substances having one or more carbon-bromine bonds formed in the plasma, is deposited on desired portions of the surface of a substrate to be etched, can yield a satisfactory sidewall and/or underlying layer protection effect concurrently with an improved resist selectivity through the function of the high boiling point of the deposit.

Other examples and variations will be obvious to those skilled in the art, and this invention is not to be limited to the specific matters stated above.

What is claimed is:

1. A method for forming a gate electrode of a semiconductor device, comprising:

providing a semiconductor substrate having a stack of a resist mask layer, an organic coating layer, a conductive material layer, and a gate dielectric layer, the resist mask layer including a resist mask pattern partially masking the organic coating layer;

etching the organic coating layer through the resist mask layer using an etching gas atmosphere including $O_2$, $Cl_2$, and HBr to form a pattern of the organic coating corresponding with the resist mask pattern, the etching including controllably reducing a width of the resist mask pattern such that a width of the pattern of the organic coating is determined by the reduced width of the resist mask pattern; and patterning the conductive material layer by etching through the pattern of the organic material, wherein:

the mask pattern includes an isolated mask pattern having a first lateral mask dimension before the etching and a densely arranged mask pattern having a second lateral mask dimension before the etching;

the pattern of the organic coating includes an isolated pattern corresponding with the isolated mask pattern and a densely arranged pattern corresponding with the densely arranged mask pattern; and the etching is performed such that the isolated pattern has a first lateral dimension, the densely arranged pattern has a second lateral dimension, and a first difference between the first lateral dimension of the pattern and the first lateral dimension of the mask pattern is substantially identical to a second difference between the second lateral dimension of the pattern and the second lateral dimension of the mask pattern.

2. The method according to claim 1, wherein the etching comprises an overetching, an amount of the overetching is selected to control the first difference and the second difference.

3. A method for manufacturing a semiconductor device, comprising:

providing a semiconductor substrate having an organic material layer thereon and a mask layer having a mask pattern partially masking the organic material layer; and etching the organic material layer through the mask layer using an etching gas atmosphere including $O_2$, $Cl_2$, and HBr to form a pattern of the organic material layer corresponding with the mask pattern, the etching including controllably reducing a lateral dimension of the pattern, wherein:

the mask pattern includes an isolated mask pattern having a first lateral mask dimension before the etching and a densely arranged mask pattern having a second lateral mask dimension before the etching;

the pattern of the organic coating includes an isolated pattern corresponding with the isolated mask pattern and a densely arranged pattern corresponding with the densely arranged mask pattern; and the etching is performed such that the isolated pattern of the organic material layer has a first lateral dimension, the densely arranged pattern of the organic material layer has a second lateral dimension, and a first difference between the first lateral dimension of the pattern and the first lateral dimension of the mask is substantially identical to a second difference between the second lateral dimension of the pattern and the second lateral dimension of the mask.

4. The method according to claim 1, wherein the conductive material layer includes a polycrystalline silicon layer.

5. The method according to claim 1, wherein the organic coating layer is a bottom anti-reflection coating layer.

6. The method according to claim 3, wherein a ratio of $O_2$ and $Cl_2$ in the etching gas atmosphere is selected so that the first difference is substantially identical to the second difference.

7. The method according to claim 3, wherein the isolated pattern includes sidewalls that have a first angle, and the densely arranged pattern includes sidewalls that have a second angle that is substantially identical to the first angle.

8. A method for adjusting a lateral dimension of a resist mask pattern, comprising:

providing a semiconductor substrate having a resist mask layer thereon, the resist mask layer including a resist mask pattern; and adjusting a lateral dimension of the resist mask pattern by laterally etching the resist with an etching gas atmosphere including $O_2$, $Cl_2$, and HBr, wherein:

the resist mask pattern includes an isolated mask pattern and a densely arranged mask pattern; and the adjusting comprises laterally etching on the isolated mask pattern by an amount that is substantially identical to an amount of lateral etching on the densely arranged mask pattern.

9. The method according to claim 8, wherein the resist mask pattern includes sidewalls, and an angle of the sidewalls of the resist mask pattern after the adjusting is substantially identical to the angle of the sidewalls before the adjusting.

10. The method according to claim 8, wherein a ratio of $O_2$ and $Cl_2$ in the etching gas atmosphere is selected so that the amount of the lateral etching on the isolated mask pattern is substantially identical to the amount of lateral etching on the densely arranged mask pattern.

11. The method according to claim 8, wherein the isolated mask pattern includes sidewalls that have a first angle after the adjusting, and the densely arranged mask pattern includes sidewalls that have a second angle after the adjusting that is substantially identical to the first angle.

12. The method according to claim 1, wherein a ratio of $O_2$ and $Cl_2$ in the etching gas atmosphere is selected so that the first difference is substantially identical to the second difference.

13. The method according to claim 3, wherein the etching comprises an overetching, an amount of the overetching is selected to control the first difference and the second difference.

14. A method for adjusting a lateral dimension of a resist mask pattern, comprising:

providing a semiconductor substrate having a conductive material layer thereon, and a resist mask layer over the conductive material layer, the resist mask layer including a resist mask pattern;

adjusting a lateral dimension of the resist mask pattern by laterally etching the resist with an etching gas atmosphere including $O_2$, $Cl_2$, and HBr; and patterning the conductive material layer by etching through the resist mask pattern with the adjusted lateral dimension, wherein:

the resist mask pattern includes an isolated mask pattern and a densely arranged mask pattern; and the adjusting comprises laterally etching on the isolated mask pattern by an amount that is substantially identical to an amount of lateral etching on the densely arranged mask pattern.

* * * * *